US005766988A

United States Patent [19]
Cho et al.

[11] Patent Number: 5,766,988
[45] Date of Patent: Jun. 16, 1998

[54] FABRICATING METHOD FOR A THIN FILM TRANSISTOR WITH A NEGATIVELY SLOPED GATE

[75] Inventors: Seok Won Cho, Chungcheongbuk-do; Jong Moon Choi, Seoul, both of Rep. of Korea

[73] Assignee: LG Semicon Co., Ltd., Cheongju, Rep. of Korea

[21] Appl. No.: 690,886

[22] Filed: Aug. 2, 1996

Related U.S. Application Data

[62] Division of Ser. No. 440,027, May 12, 1995, Pat. No. 5,578,838.

[30] Foreign Application Priority Data

May 12, 1994 [KR] Rep. of Korea ............... 94-10410

[51] Int. Cl.$^6$ ................................. H01L 21/84
[52] U.S. Cl. ................... 438/159; 438/302; 438/585; 438/163
[58] Field of Search ................... 438/151, 156, 438/158, 159, 160, 163, 301, 302, 303, 525, 585, 595, 701, 713, 944, 177, 183, 193, 200, 204, 492

[56] References Cited

U.S. PATENT DOCUMENTS

| 4,343,078 | 8/1982 | Miyagi | 438/585 |
| 5,610,082 | 3/1997 | Oh | 438/160 |

FOREIGN PATENT DOCUMENTS

| 61-150375 | 7/1986 | Japan | 438/204 |
| 63-70571 | 3/1988 | Japan | 438/204 |
| 2-45935 | 2/1990 | Japan . | |
| 2-65128 | 3/1990 | Japan . | |
| 4-215441 | 8/1992 | Japan | 438/177 |
| 6-132299 | 5/1994 | Japan . | |
| 8-204184 | 8/1996 | Japan . | |

OTHER PUBLICATIONS

H. Tsutsu et al. Proc. of the Electrochem. Soc. 92(24)(1992)138 "A Novel Tapered Etching Technology of Al-2% Si Alloy".

C.T. Liu, et al.; "High Reliability and High Performance 0.35um Gate-Inverted TFT's for 16Mbit SRAM Applications Using Self-Aligned LDD Structures"; IEDM pp. 823-826 Dec. 1992.

Primary Examiner—Charles L. Bowers, Jr.
Assistant Examiner—Leon Radomsky
Attorney, Agent, or Firm—Loudermilk & Associates

[57] ABSTRACT

A thin film transistor and a fabricating method for a thin film transistor is disclosed which may be suitable for memory cells of a static random access memory (SRAM) or other devices. A thin film transistor according to this invention may include an insulation substrate, a gate electrode formed to have a negative slope at one side thereof on the insulation substrate, an insulation film side wall formed at the other side of the gate electrode, a gate insulation film formed on the insulation substrate, gate electrode and side wall, a semiconductor layer formed on the gate insulation film, impurity diffusion regions selectively formed within the semiconductor layer over the gate electrode, the side wall and the insulation substrate on the other side of the gate electrode, and a channel region formed within the semiconductor layer at the side of the gate electrode having the negative slope. A method for fabricating a thin film transistor in accordance with this invention may include processes for forming a gate electrode on an insulation substrate, forming a side wall at a side of the gate electrode, etching the other side of the gate electrode selectively to have a negative slope, depositing a gate insulation film and a semiconductor layer successively on the overall surface, forming a source and a drain regions by an vertical ion injunction. Transistors having a negative slope at both sides of the gate electrode also are disclosed.

15 Claims, 4 Drawing Sheets

FABRICATING METHOD FOR A THIN FILM TRANSISTOR WITH A NEGATIVELY SLOPED GATE

This is a divisional of application(s) Ser. No. 08/440,027 filed on May 12, 1995 now U.S. Pat. No 5,578,838.

FIELD OF THE INVENTION

This invention relates to thin film transistors of semiconductor devices, and more particularly to a structure of and fabricating method for a thin film transistor which is suitable for memory cells of a static random access memory (SRAM).

BACKGROUND OF THE INVENTION

In general, a thin film transistor typically is used in place of a load resistor in SRAMs of 1 mega-bit or higher densities and also is widely used as a switching element for switching image data signals of pixel regions in a liquid crystal display. In order to obtain a high quality SRAM, it is necessary to decrease the power consumption and improve the memory characteristics by decreasing the off current and increasing the on current of thin film transistors. Accordingly, research has been conducted towards improving the on/off current ratio.

A conventional method for fabricating a thin film transistor to improve the on/off current ratio based on above principle is to be explained hereinafter, referring to the attached drawings. FIGS. 1A to 1D are sectional drawings illustrating processes for fabricating a conventional thin film transistor, in which the fabrication of the MOS thin film transistor utilizes a bigger grain size by a solid state grain growth of body polysilicon based on a bottom gate. The solid state grain growth in this case is achieved by a heat treatment for a long time (about 24 hours) at a temperature of about 600° C.

As illustrated in FIG. 1A, polysilicon is deposited on insulation substrate 1 (or an insulation film), and the polysilicon is subjected to a patterning with a photo etching process using a gate mask, forming gate electrode 2. As illustrated in FIG. 1B, gate insulation film 3 and body polysilicon 4 are deposited successively with chemical vapor deposition (CVD) methods on the overall surface thereof. Thereafter, the grain size of the body polysilicon is grown bigger through a solid state grain growth method of heat treating for a long time (about 24 hours) at a temperature of about 600° C.

As illustrated in FIG. 1C, photosensitive film 5 is deposited on polysilicon 4 and is subjected to an exposure and a development process, thereby masking a channel region. The masking of the channel region is carried out for source region 6a to overlap with gate electrode 2 and for drain region 6b to off-set gate electrode 2.

As illustrated in FIGS. 1C and 1D, p type impurities ($BF_2$) are injected into exposed body polysilicon 4 forming source region 6a and drain region 6b, completing fabrication of a conventional p type MOS thin film transistor. The letters a, b, c and d in FIG. 1D indicate a source region, a channel region, an offset region and a drain region, respectively.

Such a conventional method for fabricating a thin film transistor has following problems.

First, because the channel region as well as the offset region are defined with a photomask process at the same time, which is a complicated process, hard to reproduce and seriously varies the off current depending on the degree of alignment, the reliability of the thin film transistor becomes lower.

Second, as the channel of the thin film transistor is constructed in a planar manner, as the cell size becomes smaller the length of the channel becomes shorter, which may result in an increase in leakage current, and it is difficult to achieve high integration.

SUMMARY OF THE INVENTION

An object of this invention designed to address the foregoing problems uses a simplified process employing a self alignment method, while minimizing the cell size.

These and other objects and features of this invention can be achieved by providing a structure of a thin film transistor including an insulation substrate, a gate electrode formed to have a negative slope at one side thereof on the insulation substrate, an insulation film side wall formed at the other side of the gate electrode, a gate insulation film formed on the insulation substrate, gate electrode and side wall, a semiconductor layer formed on the gate insulation film, impurity diffusion regions selectively formed within the semiconductor layer over the gate electrode, the side wall and the insulation substrate on the other side of the gate electrode, and a channel region formed within the semiconductor layer at the one side of the gate electrode, and by providing a method for fabricating a thin film transistor including processes for forming a gate electrode which is to have a negative slope on one side thereof on an insulation substrate, forming a side wall at the other side of the gate electrode, selectively etching the one side of the gate electrode selectively to have a negative slope thereof, depositing a gate insulation film and a semiconductor layer successively on all over the surface, forming source and drain regions by a vertical ion injection.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

This invention is to be explained in more detail hereinafter, referring to the attached drawings.

Figure 1A:
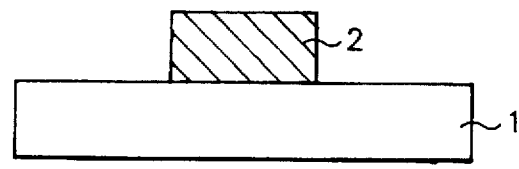
FIGS. 1A to 1D are sectional drawings illustrating conventional processes for fabricating a thin film transistor.
Figure 1B:
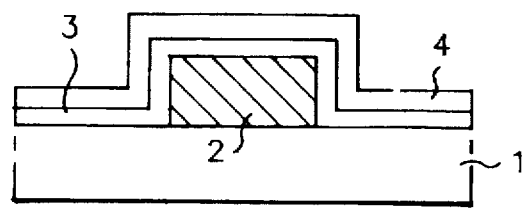
Figure 1C:
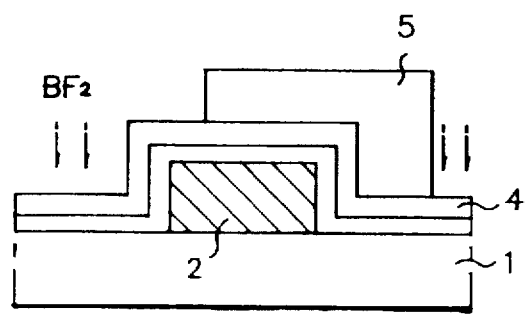
Figure 1D:
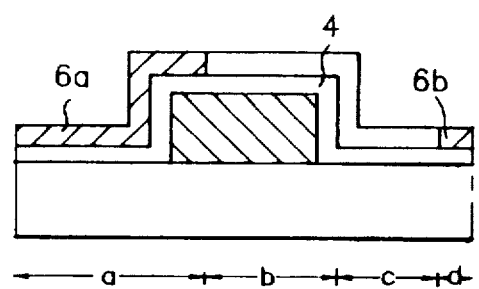
Figure 2A:
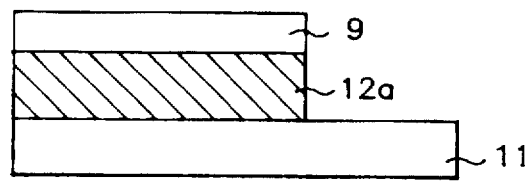
FIGS. 2A to 2E are sectional drawings illustrating processes for fabricating a thin film transistor in accordance with a first embodiment of this invention.
Figure 2B:
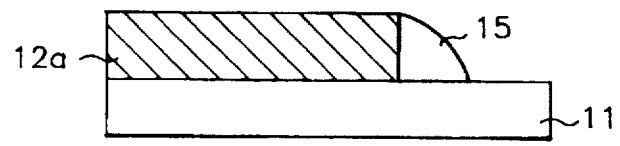
Figure 2C:
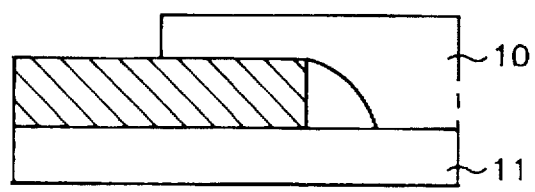
Figure 2D:
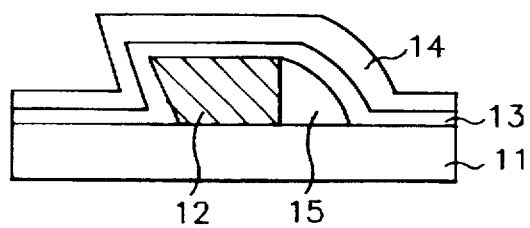
Figure 2E:
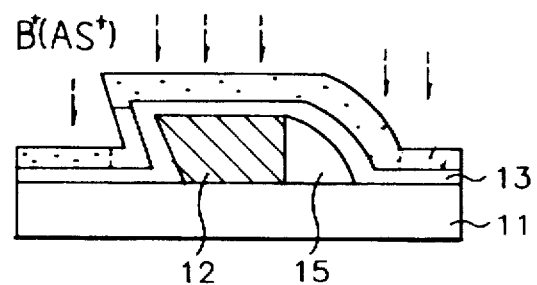
Figure 3:
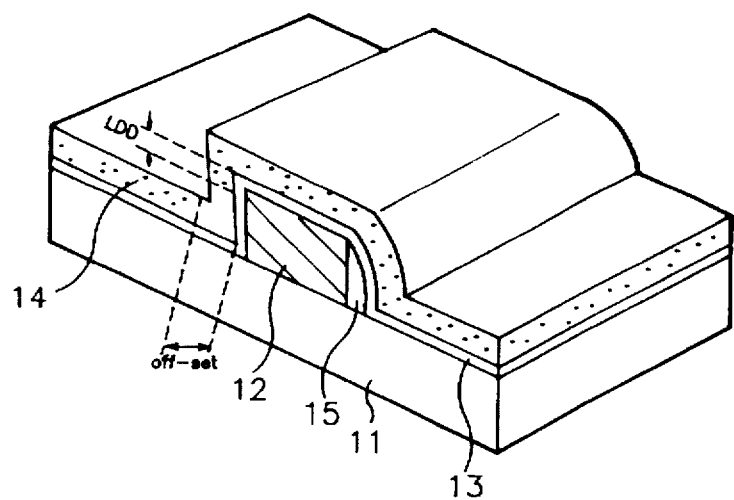
FIG. 3 is a perspective view of a thin film transistor in accordance with the first embodiment of this invention.
Figure 4:
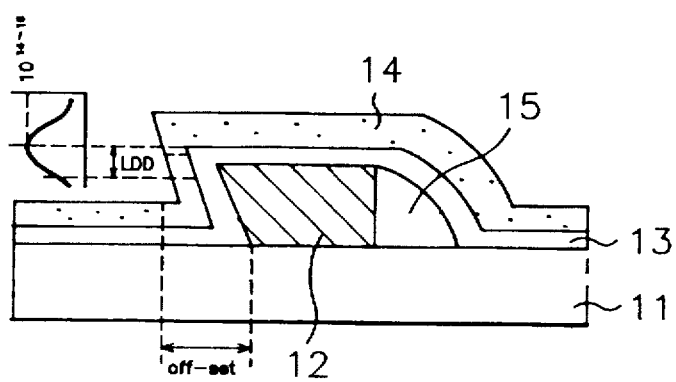
FIG. 4 illustrates the density of injected ions in accordance with the first embodiment of this invention.

FIGS. 2A to 2E are sectional drawings illustrating processes for fabricating a thin film transistor in accordance with a first embodiment of this invention, FIG. 3 is a perspective view of a thin film transistor in accordance with the first embodiment of this invention, and FIG. 4 illustrates the density of ions injected in accordance with the first embodiment of this invention.

A structure of a thin film transistor in accordance with the first embodiment of this invention includes gate electrode 12 formed on insulation substrate 11 to have a negative slope on one side thereof, insulation film side wall 15 formed at the other side of gate electrode 12, gate insulation film 13 and semiconductor layer 14 formed successively on insulation substrate 11, gate electrode 12 and insulation film side wall 15, impurity diffusion layers for a source and a drain selectively formed within semiconductor layer 14 over gate electrode 12, insulation film side wall 15 and insulation substrate 11 on one side of gate electrode 12, and a channel region formed within semiconductor layer 14 at the one side of gate electrode 12 having a negative slope.

The method for fabricating a thin film transistor in accordance with this invention having the foregoing structure is as follows.

As illustrated in FIG. 2A, polysilicon 12a for a gate electrode and first photosensitive film 9 are deposited successively on insulation substrate 11 (or an insulation film which may be on a substrate), which is subjected to an exposure and development process defining one side of the gate electrode, and exposed polysilicon 12a for a gate electrode is selectively etched with an anisotropic dry etching process.

As illustrated in FIG. 2B, after removing first photosensitive film 9, an insulation film is deposited on the overall surface, which is subjected to an etch back forming insulation film side wall 15 at the side of polysilicon 12a.

As illustrated in FIG. 2C, second photosensitive film 10 is deposited, and a gate electrode region is defined centered on the part where insulation film side wall 15 has been formed with exposure and development processes, which is subjected to an etching process using second photo sensitive film 10 as a mask, thereby selectively removing exposed polysilicon 12a as illustrated in FIG. 2D.

At this time, so as to have a negative slope formed at the time of etching polysilicon 12a, a dry etching with $SF_6+F_{123}$ chemicals is carried out in such a manner so that gate electrode 12 has a negative slope on the side thereof.

That is, by proper selection of the etching method of polysilicon 12a, a negative slope may be created as illustrated. In a preferred embodiment this is carried out with a dry etching using $SF_6+F_{123}$ chemicals in amounts so as to have a ratio of $SF_6:F_{123}$ of over 1:1, so that the $SF_6$ can be distributed in a sufficient amount within the lower portion of polysilicon 12, which etches the side of polysilicon 12a, forming a negative slope. Because $SF_6$ does not react with the photosensitive film, polymer is believed not to be grown from the side of polysilicon 12a. Therefore, since the side wall is not protected but exposed to etching, the etching may proceed so that polysilicon 12a has a negative slope.

As illustrated in FIG. 2E, impurity ions are injected vertically into the semiconductor layer (body polysilicon) 14 without an additional masking process, forming source and drain regions, and resulting in a thin film transistor in accordance with this invention.

At this time, if a p type thin film transistor is to be formed, p type impurities (such as Boron) are injected with an ion injection energy of about 5 KeV to 80 Kev to have a density of impurities of about $1\times10^{14}$ to $1\times10^{16}$ atoms/cm$^2$.

If an n type thin film transistor is to be formed, n type impurities (such as As) are injected with an ion injection energy of about 10 KeV to 50 KeV to have a density of impurities of about $1\times10^{14}$ to $1\times10^{16}$ atoms/cm$^2$.

FIG. 4 illustrates the density of the injected ions in accordance with this invention. If impurities are ion injected as has been described, a structure having an offset formed between the source region and gate electrode 12, a channel region (adjacent to the source and drain regions) within semiconductor layer 14 at one side of gate electrode 12 having a negative slope, and a lightly doped drain (LDD) formed adjacent to a side of the channel region, can be seen.

Since the difference of density that develops depends on the depth of ion injection, if an ion injection is carried out in a condition as illustrated above, an LDD structure may be formed in a self aligned manner along the depth within semiconductor layer 14 at one side of gate electrode 12, an offset may be formed in a self aligned manner between the source region and the gate electrode due to the negative slope angle of gate electrode 12.

If the negative slope angle is formed to a greater degree, the length of the offset becomes longer, and if the negative slope angle is formed to a lesser degree, the length of the offset becomes shorter. Thus, the off current can be decreased because the offset length can be fixed by the negative slope angle of gate electrode 12 without having an additional masking process.

Figure 5:
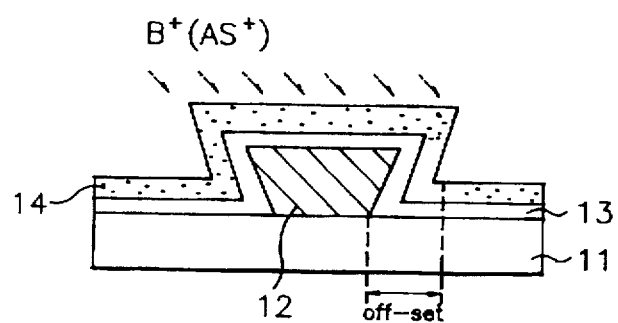
FIG. 5 is a sectional drawing illustrating a fabricating process in accordance with a second embodiment of this invention.

FIG. 5 is a sectional view illustrating a fabrication process of a thin film transistor in accordance with a second embodiment of this invention. The thin film transistor in accordance with the second embodiment of this invention includes a structure having, referring to the structure of the thin film transistor in accordance with the first embodiment of this invention, gate electrode 12 formed to have negative slopes at both sides thereof on insulation substrate 11, gate insulation film 13 and semiconductor layer 14 formed successively on insulation substrate 11 and gate electrode 12, a channel region formed within semiconductor layer 14 at one side of gate electrode 12, and impurity diffusion regions for a source and a drain formed within the semiconductor layer 14 on both sides centered on the channel region.

The method for fabricating the thin film transistor in accordance with the second embodiment of this invention having the foregoing structure is to be explained hereinafter.

Polysilicon for a gate and a photosensitive film (not illustrated) are deposited on the overall surface of insulation substrate 11 (or an insulation film), which is subjected to exposure and development processes defining a gate electrode region. The polysilicon is subjected to a dry etching which may be with the same chemicals as with the first embodiment of this invention (using $SF_6+F_{123}$ chemicals in a proper amount), forming gate electrode 12 having negative slopes at both sides thereof. Gate insulation film 13 and semiconductor layer 14 are formed successively on gate electrode 12 and insulation substrate 11.

By injecting impurity ions into semiconductor layer 14 with an inclination angle thereto as illustrated, source and drain regions may be formed therein, and fabrication of a thin film transistor in accordance with the second embodiment of this invention is completed. In injecting the impurities, the same impurities in densities as with the first embodiment of this invention may be utilized. When impurities are injected under the foregoing condition, an offset is formed between the source region and gate electrode 12, and a channel region is formed within the semiconductor layer at one side of gate electrode 12 having a negative slope.

Figure 6:
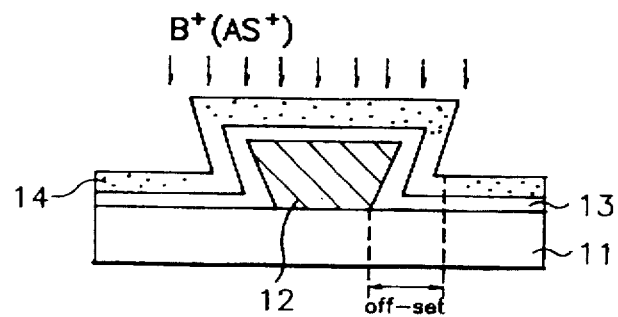
FIG. 6 is a sectional drawing illustrating a fabricating process in accordance with a third embodiment of this invention.

FIG. 6 is a sectional view illustrating a fabricating process of a thin film transistor in accordance with a third embodiment of this invention, wherein, referring to the method for fabricating a thin film transistor in accordance with the second embodiment of this invention, fabrication of a thin film transistor in accordance with this embodiment can be completed by injecting impurity ions into the semiconductor layer vertically forming source region and drain region offsets with a gate electrode and channel regions within semiconductor layer 14 on both sides of gate electrode 2 having negative slopes as illustrated.

The structure of and fabrication method for a thin film transistor in accordance with this invention described above has following advantages.

First, by forming a side wall at one side of a gate electrode of a thin film transistor, a process for an offset region on the source side can be eliminated, and on current can be improved more.

Second, since a source and a drain as well as an LDD structure can be formed in a self aligned manner without having an additional masking process, it is possible to improve the characteristics of the element as well as simplify the process, which can improve the yields.

Third, because the channel length of the thin film transistor is fixed depending on the negative slope angle of the gate electrode, the cell size can be made smaller than if the channel length is fixed depending on the line width of the gate electrode, and because the channel length of the thin film transistor depends on both an offset length and the negative slope angle of the gate electrode, a cell size can be made smaller improving the degree of integration.

Fourth, because the lengths of the offset and the channel can be adjusted by adjusting the negative slope angle of the gate electrode, a thin film transistor suited for a particular use can be obtained without an additional masking-process.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor comprising the steps of:

forming a conduction layer on an insulation substrate;

forming a first side of a gate electrode by patterning the conduction layer;

forming an insulation film side wall at the first side of the gate electrode;

forming a second side of the gate electrode by etching the conduction layer, wherein the second side of the gate electrode has a negative slope; and forming an insulation film and a semiconductor layer on the gate electrode; and injecting impurity ions into the semiconductor layer, wherein a channel region is formed at the second side of the gate electrode, and source and drain regions are formed in the semiconductor layer adjacent to the channel region.

2. The method of claim 1, wherein the step of forming the second side of the gate electrode to have a negative slope comprises a dry etching using $SF_6+F_{123}$ chemicals.

3. The method of claim 1, wherein the thin film transistor comprises a p channel transistor, and the injection of impurity ions comprises injecting p type impurity ions with an energy of about 5 KeV to 20 KeV and a density of about $1\times10^{14}$ to $1\times10^{16}$ atoms/cm$^2$.

4. The method of claim 1, wherein the thin film transistor comprises an n channel transistor, and the injection of impurity ions comprises injecting n type impurity ions with an energy of about 10 KeV to 50 Kev and a density of about $1\times10^{14}$ to $1\times10^6$ atoms/cm$^2$.

5. The method of claim 1, wherein the semiconductor layer comprises polysilicon.

6. The method of claim 1, wherein the semiconductor layer is formed to have a thickness of about 200 to 500 Angstroms.

7. A method for fabricating a thin film transistor comprising the steps of:

forming a conduction layer on an insulation substrate;

patterning the conduction layer to form a gate electrode having first and second sides, wherein the first and second sides each have a negative slope;

forming a gate insulation film on the gate electrode and the insulation substrate;

forming a semiconductor layer on the gate insulation film; and injecting impurity ions into the semiconductor layer at an inclination angle, wherein a channel region is formed at the first side of the gate electrode, wherein source and drains are formed in the semiconductor layer adjacent to the channel region.

8. The method of claim 7, wherein the patterning of the gate electrode to have negative slopes at the first and second sides thereof comprises a dry etching using $SF_6+F_{123}$ chemicals.

9. The method of claim 7, wherein the thin film transistor comprises a p channel transistor, and the injection of impurity ions comprises injecting p type impurity ions with an energy of about 5 KeV to 20 KeV and a density of about $1\times10^{14}$ to $1\times10^6$ atoms/cm$^2$.

10. The method of claim 7, wherein the thin film transistor comprises an n channel transistor, and the injection of impurity ions comprises injecting n type impurity ions with an energy of about 10 KeV to 50 KeV and a density of about $1\times10^4$ to $1\times10^{16}$ atoms/cm$^2$.

11. The method of claim 7, wherein the semiconductor layer comprises polysilicon.

12. A method for fabricating a thin film transistor comprising the steps of:

forming a conduction layer on an insulation substrate;

patterning the conduction layer to form a gate electrode having first and second sides, wherein the first and second sides each have a negative slope;

forming a gate insulation film on the gate electrode and the insulation substrate;

forming a semiconductor layer on the gate insulation film; and injecting impurities into the semiconductor layer, wherein channel regions are formed at the first and second sides of the gate electrode, wherein source and drain regions are formed in the semiconductor layer adjacent to the channel regions.

13. The method of claim 12, wherein the patterning of the gate electrode to have negative slopes at the first and second sides thereof comprises a dry etching using $SF_6+F_{123}$ chemicals.

14. The method of claim 12, wherein the semiconductor layer is formed to have a thickness of about 200 to 500 Angstroms.

15. The method of claim 12, wherein the semiconductor layer comprises polysilicon.

* * * * *